(12) United States Patent
Schinella et al.

(10) Patent No.: US 6,350,700 B1
(45) Date of Patent: Feb. 26, 2002

(54) PROCESS FOR FORMING TRENCHES AND VIAS IN LAYERS OF LOW DIELECTRIC CONSTANT CARBON-DOPED SILICON OXIDE DIELECTRIC MATERIAL OF AN INTEGRATED CIRCUIT STRUCTURE

(75) Inventors: Richard D. Schinella; Wilbur G. Catabay, both of Saratoga; Philippe Schoenborn, San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/607,512

(22) Filed: Jun. 28, 2000

(51) Int. Cl.$^7$ ................................................. H01L 21/00
(52) U.S. Cl. ...................... 438/723; 216/79; 438/724; 438/725; 438/734; 438/740
(58) Field of Search ................................. 438/636, 637, 438/675, 723, 724, 725, 734, 735, 738, 743, 744, 740; 216/67, 79

(56) References Cited

U.S. PATENT DOCUMENTS 3,012,861 A    12/1961    Ling ........................... 23/223.5

(List continued on next page.)

FOREIGN PATENT DOCUMENTS

DE    198 04 375 A1    7/1999

(List continued on next page.)

*Primary Examiner*—William A. Powell
(74) *Attorney, Agent, or Firm*—John P. Taylor, Esq.

(57) ABSTRACT

A low k carbon-doped silicon oxide dielectric material dual damascene structure is formed by improvements to a process wherein a first photoresist mask is used to form via openings through a first layer of low k carbon-doped silicon oxide dielectric material, followed by removal of the first photoresist mask; and wherein a second photoresist mask is subsequently used to form trenches in a second layer of low k carbon-doped silicon oxide dielectric material corresponding to a desired pattern of metal interconnects for an integrated circuit structure, followed by removal of the second photoresist mask. The improved process of the invention comprises: forming a first hard mask layer over an upper layer of low k carbon-doped silicon oxide dielectric material previously formed over an etch stop layer formed over a lower layer of low k carbon-doped silicon oxide dielectric material on an integrated circuit structure; forming a first photoresist mask having a pattern of via openings therein over the first hard mask layer; etching the first hard mask layer through the first photoresist mask to form a first hard mask having the pattern of vias openings replicated therein without etching the layers of low k carbon-doped silicon oxide dielectric material beneath the first hard mask; then removing the first photoresist mask; forming a second hard mask layer over the first hard mask; forming a second photoresist mask having a pattern of trench openings therein over the second hard mask layer; etching the second hard mask layer through the second photoresist resist mask to form a second hard mask having the pattern of trench openings replicated therein without etching the layers of low k carbon-doped silicon oxide dielectric material beneath the first and second hard masks; then removing the second photoresist mask; then using the first and second hard masks to respectively form the via openings in the lower layer of low k carbon-doped silicon oxide dielectric material and trench openings in the upper layer of low k carbon-doped silicon oxide dielectric material; whereby a pattern of via openings and a pattern of trench openings can be formed in layers of low k carbon-doped silicon oxide dielectric material without damage to the low k carbon-doped silicon oxide dielectric material during removal of the photoresist masks used respectively in the formation of the pattern of via openings and the pattern of trench openings.

28 Claims, 6 Drawing Sheets

U.S. PATENT DOCUMENTS

| | | | |
|---|---|---|---|
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,935,868 A * | 8/1999 | Fang et al. | 438/723 X |
| 5,939,763 A | 8/1999 | Hao et al. | 257/411 |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,184,142 B1 * | 2/2001 | Chung et al. | 438/723 X |
| 6,204,192 B1 | 3/2001 | Zhao et al. | 438/723 |
| 6,207,576 B1 * | 3/2001 | Wang et al. | 438/723 X |
| 6,232,658 B1 | 5/2001 | Catabay et al. | 257/701 |

FOREIGN PATENT DOCUMENTS

| | | |
|---|---|---|
| EP | 0 706 216 A2 | 4/1996 |
| EP | 0 949 663 A2 | 10/1999 |
| JP | 63003437 | 1/1988 |
| JP | 2000-267128 | 9/2000 |
| WO | WO99/41423 | 8/1999 |

OTHER PUBLICATIONS

Koda, Seiichiro, et al., "A Study of Inhibition Effects for Silane Combustion by Additive Gases", *Combustion and Flame*, vol. 73, No. 2, Aug. 1988, pp. 187–194.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Pursuing the Perfect Low–K Dieletric", *Semiconductor International*, vol. 21, No. 10, Sep., 1998, pp. 64–66, 68, 70, 72, and 74.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

* cited by examiner

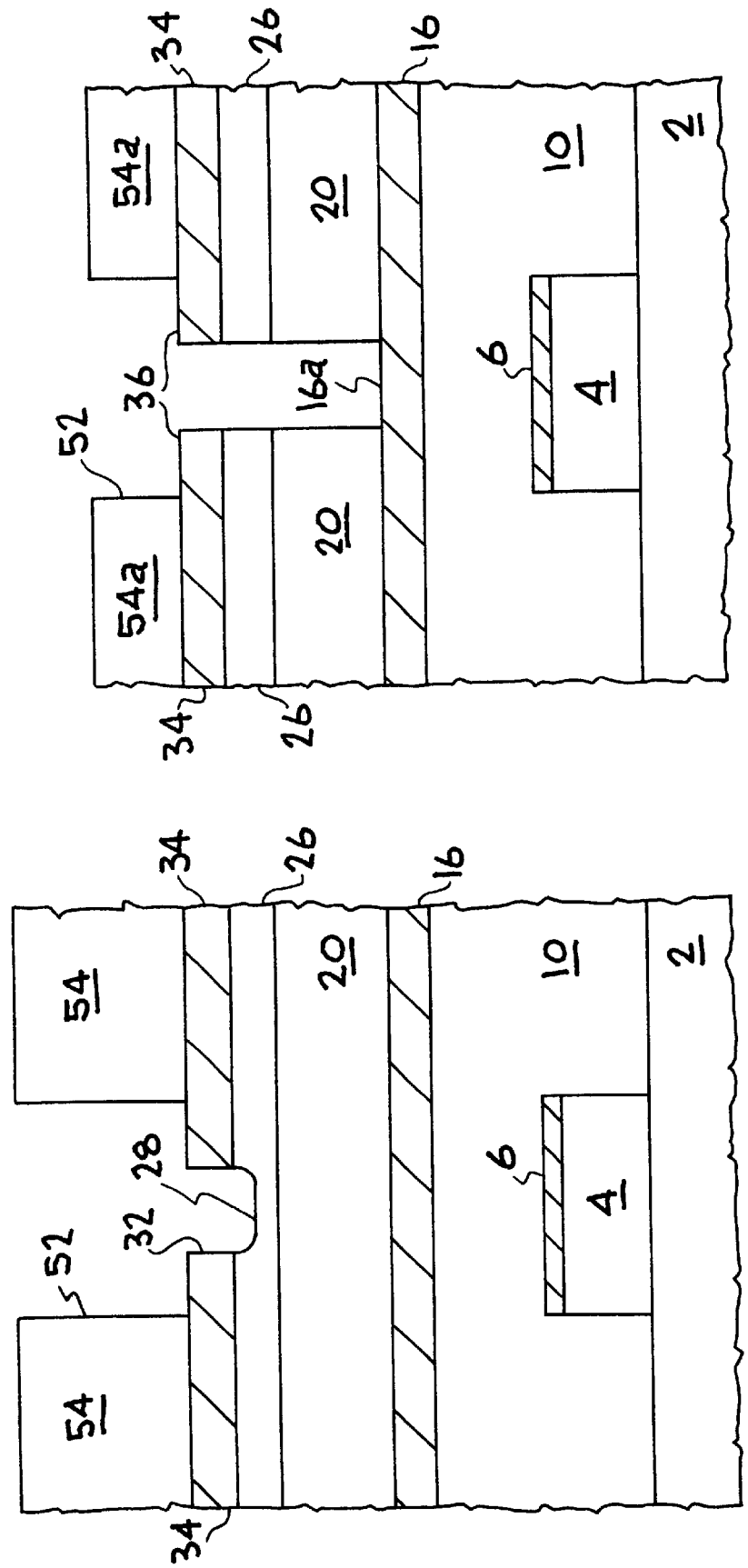

PROCESS FOR FORMING TRENCHES AND VIAS IN LAYERS OF LOW DIELECTRIC CONSTANT CARBON-DOPED SILICON OXIDE DIELECTRIC MATERIAL OF AN INTEGRATED CIRCUIT STRUCTURE

CROSS REFERENCE TO RELATED APPLICATION

The subject matter of this application relates to the subject matter of copending U.S. patent application Ser. No. 09/607,511, entitled "PROCESS FOR FORMING TRENCHES AND VIAS IN LAYERS OF LOW DIELECTRIC CONSTANT CARBON-DOPED SILICON OXIDE DIELECTRIC MATERIAL OF AN INTEGRATED CIRCUIT STRUCTURE", assigned to the assignee of this application, and filed on Jun. 28, 2000.

BACKGROUND OF THE INVENTION

1. Field of the Invention

This invention relates to the formation of a dual damascene structure comprising trenches and vias in low dielectric constant (low k) carbon-doped silicon oxide dielectric material. More particularly, this invention relates to a process for forming a dual damascene structure comprising patterns of trenches and vias respectively formed in layers of low k carbon-doped silicon oxide dielectric material of an integrated circuit structure while mitigating damage to the low k carbon doped silicon oxide dielectric material during removal of the photoresist masks used in the formation of the respective trenches and vias of the dual damascene structure.

2. Description of the Related Art

The shrinking of integrated circuits has resulted in levels of interconnects, including metal interconnects, being placed closer together, as well as reduction of the horizontal spacing between metal lines on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is then annealed to remove moisture. Such carbon-containing silicon oxide insulating materials formed in this manner, sometimes referred to as low k carbon-doped silicon oxide dielectric material, exhibit good gap-filling capabilities and at the same time are characterized by a dielectric constant less than 3.0 and remain stable during subsequent annealing at temperatures of up to 500° C.

However, it has been found that such carbon-doped silicon oxide dielectric material is more sensitive than conventional undoped silicon oxide to process procedures or systems subsequently carried out during formation of the integrated circuit structure. For example, the low k carbon-doped silicon oxide dielectric material has been found to be easily damaged by the conventional $O_2$-based ashing system used to remove photoresist masks after vias or contact openings are formed through the low k dielectric material. While upper and lower capping layers of conventional undoped $SiO_2$ can be applied below and above the layer of carbon-doped silicon oxide dielectric material, to respectively protect the lower and upper surfaces of the low k material, this does not protect the freshly exposed sidewall surfaces of newly formed vias or contact openings etched through the layer of low k carbon-doped silicon oxide dielectric material. The carbon-silicon bonds in the low k carbon-doped silicon oxide dielectric material are more easily attacked and broken by the oxygen atoms utilized in the ashing treatment than are the silicon-oxygen bonds in conventional undoped silicon oxide dielectric material.

Many of the same reasons for turning to the use of dielectric materials having lower dielectric constants, e.g., for increased performance, including speed, have also led to the increased use of copper instead of aluminum or tungsten in the formation of metal interconnects, as well as via filler material, for integrated circuit structures. However, while a layer of aluminum interconnects may be easily formed by depositing a layer of aluminum metal over a dielectric layer of an integrated circuit structure, followed by patterning of the aluminum layer through a mask to form aluminum interconnects, and subsequent deposition of dielectric material in the spaces between the metal interconnects, layers of copper interconnects are not so easily formed. This is due to difficulty in patterning (etching) of a previously deposited copper layer. This has lead to the development of a process commonly known as the damascene or dual damascene process.

In the damascene process the dielectric material which will separate the copper interconnects is first deposited as a dielectric layer in which trenches are then formed (usually through the entire thickness of the dielectric layer), corresponding to the desired pattern of copper interconnects. A layer of copper is then deposited over the patterned dielectric layer and into the trenches, filling them completely. All surface copper is then removed, e.g., by chemical mechanical polishing (CMP), leaving the desired pattern of copper interconnects in the trenches. When this same process is combined with the forming of openings (vias) in a lower dielectric layer to form copper-filled vias therein, followed by filling of both vias and trenches with copper, usually in a single deposition step, the process is referred to as a dual damascene process.

While the use of copper-filled vias and copper interconnects, formed in layers of low k carbon-doped silicon oxide dielectric material by the dual damascene process, would be useful, the sensitivity of the low k carbon-doped silicon oxide dielectric material to the ashing process used to remove the photoresist mask is exacerbated when copper vias and interconnects are formed in such low k carbon-doped silicon oxide dielectric material. This is because the conventional dual damascene process involves the use (and removal) of two photoresist masks, one to define the vias formed in a lower layer of low k carbon-doped silicon oxide dielectric material, and another photoresist mask to define the trenches in an upper layer of low k carbon-doped silicon oxide dielectric material, thus increasing the possibility of damage to the low k carbon-doped silicon oxide dielectric material during removal of the two photoresist masks.

It would, therefore, be desirable to provide a process wherein copper interconnects and copper-filled vias could be formed in low k carbon-doped silicon oxide dielectric material without causing damage to the low k carbon-doped silicon oxide dielectric material during the removal of the photoresist masks used to define the trench openings and vias formed in the low k carbon-doped silicon oxide dielectric material.

SUMMARY OF THE INVENTION

The invention comprises a dual damascene structure of vias and trenches, formed using layers of low k carbon-doped silicon oxide dielectric material, and a process for making same, wherein a pattern of via openings and a pattern of trench openings can be respectively formed in layers of low k carbon-doped silicon oxide dielectric material without damage to the low k carbon-doped silicon oxide dielectric material during removal of photoresist masks used respectively in the formation of the pattern of via openings and the pattern of trench openings in the layers of low k carbon-doped silicon oxide dielectric material.

The low k carbon-doped silicon oxide dielectric material dual damascene structure of the invention is formed by improvements to a process wherein a first photoresist mask is used to form via openings through a first layer of low k carbon-doped silicon oxide dielectric material, followed by removal of the first photoresist mask; and wherein a second photoresist mask is subsequently used to form trenches in a second layer of low k carbon-doped silicon oxide dielectric material corresponding to a desired pattern of metal interconnects for an integrated circuit structure, followed by removal of the second photoresist mask.

The improved process of the invention comprises: forming a first hard mask layer over an upper layer of low k carbon-doped silicon oxide dielectric material previously formed over a lower layer of low k carbon-doped silicon oxide dielectric material on an integrated circuit structure; forming a first photoresist mask having a pattern of via openings therein over the first hard mask layer; etching the first hard mask layer through the first photoresist mask to form a first hard mask having the pattern of vias openings replicated therein without etching the layers of low k carbon-doped silicon oxide dielectric material beneath the first hard mask; then removing the first photoresist mask; forming a second hard mask layer over the first hard mask; forming a second photoresist mask having a pattern of trench openings therein over the second hard mask layer; etching the second hard mask layer through the second photoresist resist mask to form a second hard mask having the pattern of trench openings replicated therein without etching the layers of low k carbon-doped silicon oxide dielectric material beneath the first and second hard masks; then removing the second photoresist mask; then using the first and second hard masks to respectively form the via openings in the lower layer of low k carbon-doped silicon oxide dielectric material and trench openings in the upper layer of low k carbon-doped silicon oxide dielectric material; whereby a pattern of via openings and a pattern of trench openings can be respectively formed in layers of low k carbon-doped silicon oxide dielectric material without damage to the low k carbon-doped silicon oxide dielectric material during removal of the photoresist masks used respectively in the formation of the pattern of via openings and the pattern of trench openings.

BRIEF DESCRIPTION OF THE DRAWINGS

FIG. 5 shows the structure of FIG. 4 after removal of the second photoresist mask.

FIG. 6 shows the structure of FIG. 5 after etching of the upper layer of low k carbon-doped silicon oxide dielectric material through the first hard mask down to the etch stop layer.

DETAILED DESCRIPTION OF THE INVENTION

Figure 1:
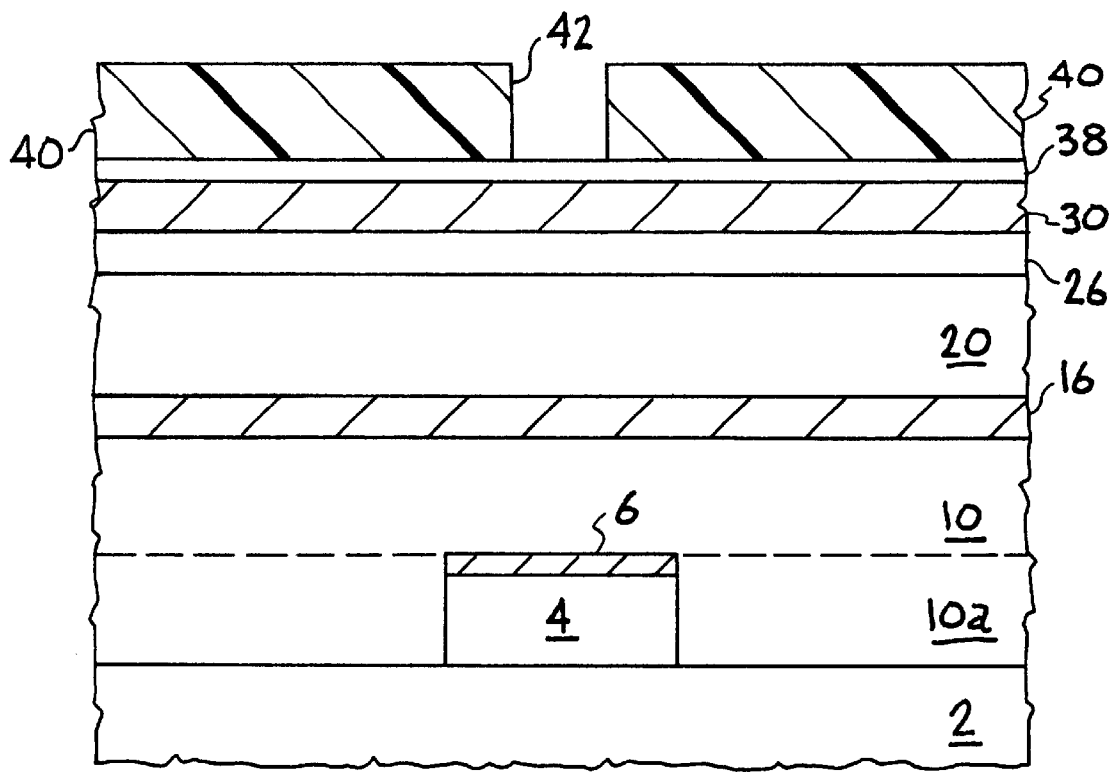
FIG. 1 is a fragmentary vertical cross-sectional view of an integrated circuit structure having a capped raised conductor shown formed over underlying integrated circuit structure and two layers of low k carbon-doped silicon oxide dielectric material separated by an etch stop layer shown formed over the raised conductor with a capping layer, then a first hard mask layer, and then an antireflective coating (ARC) formed over the layers of low k carbon-doped silicon oxide dielectric material, with a first photoresist mask having a via opening therein shown formed over the entire structure.

The invention comprises an integrated circuit structure comprising a structure of vias and trenches known as a dual damascene structure, formed using low k carbon-doped silicon oxide dielectric material, and a process for making same wherein a pattern of via openings and a pattern of trench openings can be respectively formed in layers of low k carbon-doped silicon oxide dielectric material without damage to the low k carbon-doped silicon oxide dielectric material during removal of photoresist masks used respectively in the formation of the pattern of via openings and the pattern of trench openings in the layers of low k carbon-doped silicon oxide dielectric material.

The low k carbon-doped silicon oxide dielectric material dual damascene structure of the invention is formed by improvements to a process wherein a first photoresist mask is used to form via openings through a first layer of low k carbon-doped silicon oxide dielectric material, followed by removal of the first photoresist mask; and wherein a second photoresist mask is subsequently used to form trenches in a second layer of low k carbon-doped silicon oxide dielectric material corresponding to a desired pattern of metal interconnects for an integrated circuit structure, followed by removal of the second photoresist mask.

The improved process of the invention to form the low k carbon-doped silicon oxide dielectric material dual damascene structure of the invention permits formation of the structure without damage to the low k carbon-doped silicon oxide dielectric material during removal of photoresist masks used respectively in the formation of the pattern of via openings and the pattern of trench openings in the respective layers of low k carbon-doped silicon oxide dielectric material. Damage to the layers of low k carbon-doped silicon oxide dielectric material is inhibited by the formation of hard masks which permit such removal of the respective photoresist masks to be carried out before the steps of etching the respective layers of low k carbon-doped silicon oxide dielectric material to form the desired patterns of trenches and vias. This prevents exposure of the etched surfaces of the trenches and vias formed in the low k carbon-doped silicon oxide dielectric material to reagents such as oxygen used to remove the photoresist masks.

The improved process of the invention comprises: forming a first hard mask layer over an upper layer of low k carbon-doped silicon oxide dielectric material previously formed over an etch stop layer which, in turn, is formed over a lower layer of low k carbon-doped silicon oxide dielectric material on an integrated circuit structure; forming a first photoresist mask having a pattern of via openings therein over the first hard mask layer; etching the first hard mask layer through the first photoresist mask to form a first hard mask having the pattern of vias openings defined therein without etching the layers of low k carbon-doped silicon oxide dielectric material beneath the first hard mask; then removing the first photoresist mask; forming a second hard mask layer over the first hard mask; forming a second photoresist mask having a pattern of trench openings therein over the second hard mask layer; etching the second hard mask layer through the second photoresist resist mask to form a second hard mask having the pattern of trench openings defined therein without etching the layers of low k carbon-doped silicon oxide dielectric material beneath the first and second hard masks; then removing the second photoresist mask; then using the first hard mask to form via openings in the upper layer of low k carbon-doped silicon oxide dielectric material beneath the first hard mask down to the etch stop layer; removing exposed portions of the etch stop layer over the lower layer of low k carbon-doped silicon oxide dielectric material to form openings in the etch stop layer; removing exposed portions of the first hard mask; and using the second hard mask to form trench openings in the upper layer of low k carbon-doped silicon oxide dielectric material beneath the first hard mask, while forming via openings in the lower layer of low k carbon-doped silicon oxide dielectric material through the openings in the etch stop layer. In this manner, a pattern of via openings and a pattern of trench openings can be formed in low k carbon-doped silicon oxide dielectric material without damage to the low k carbon-doped silicon oxide dielectric material during removal of photoresist masks used respectively in the formation of the pattern of via openings and the pattern of trench openings.

Turning now to FIG. 1, an integrated circuit structure is shown at 2 having formed thereon a raised conductor 4 which may be electrically connected to portions of underlying integrated circuit structure 2. Raised conductor is preferably formed with a protective cap 6 thereon such as titanium nitride which may then be used as an etch stop during formation of a via down to raised conductor 4, as will be further discussed below. Raised conductor 4 may represent a lower level of metal interconnects, such as a layer of aluminum or copper interconnects.

When raised conductor 4 represents a layer of aluminum interconnects, a first layer 10 of low k dielectric material such as a low k carbon-doped silicon oxide dielectric material may be formed around and above raised conductor 4. Alternatively, when raised conductor 4 comprises copper, the low k layer may be formed as two layers 10 and 10a (as shown by the dotted lines in FIGS. 1 and 2), with lower level layer 10a having been formed prior to formation of raised conductor 4 followed by formation of a trench in the lower level layer using, for example, the process of the invention. In either case, the thickness of low k layer 10 above the top surface of protective cap 6 will range from about 300 nanometers (nm) to about 1000 nm, and typically will be about 500 nm.

The low k carbon-doped silicon oxide dielectric material which may be used for the formation of first low k dielectric layer 10 may comprise the reaction product of the Flowfill chemical vapor deposition (CVD) process developed by Trikon Technologies of Newport, Gwent, U.K. in which methyl silane is reacted with hydrogen peroxide, as described in the previously referenced Peters article. Alternatively the low k carbon-doped silicon oxide dielectric material may comprise one of the low k carbon-doped silicon oxide dielectric materials described and claimed in copending U.S. patent application Ser. No. 09/274,457, assigned to the assignee of this invention and the description of which is hereby incorporated herein by reference. Any other low k dielectric materials which might be damaged by conventional processing to remove photoresist masks may be also used as the dielectric material.

An optional etch stop layer 16 is then preferably formed over the upper surface of first low k dielectric layer 10 to a thickness ranging from about 20 nm to about 150 nm. Etch stop layer 16 will comprise an etchable dielectric material different from the material used to form low k carbon-doped silicon oxide dielectric layer 10 so that low k dielectric layer 10 and etch stop layer 16 may be etched independently of one another, i.e., each layer can be respectively etched by an etchant system selective to the dielectric material of the other layer. Etch stop layer 16 may, for example, comprise silicon nitride or silicon carbide.

Still referring to FIG. 1, above etch stop layer 16 is formed a second or upper layer 20 of low k dielectric material which may comprise the same low k dielectric material used to form first or lower dielectric layer 10, i.e., the low k carbon-doped silicon oxide dielectric material described above. Low k dielectric layer 20 will comprise an etchable dielectric material different from the material used to form etch stop layer 16 so that low k dielectric layer 20 and etch stop layer 16 (when used) may be etched independently of one another, i.e., each layer can be respectively etched by an etchant system selective to the dielectric material of the other layer. Second low k dielectric layer 20 may range in thickness from about 300 nm to about 1000 nm, and typically will be about 500 nm.

On the upper surface of second or upper low k dielectric layer 20 is formed a capping layer 26 which serves to protect the upper surface of low k dielectric layer 20, particularly when one of the photoresist masks is being removed, as will be described below. Capping layer 26 may comprise a conventional silicon oxide ($SiO_2$) layer having a thickness ranging from about 20 nm to about 60 nm, and typically will be about 50 nm.

Still referring to FIG. 1, a first hard mask layer 30 is then formed over capping layer 26. First hard mask layer 30 may range in thickness from about 30 nm to about 400 nm, depending upon whether it is used as a CMP stop layer. Typically, hard mask layer 30, if not used as an etch stop layer, will be about 100 nm in thickness. The thickness of first hard mask layer 30 will typically will be about 30 nm if layer 30 is used as a CMP stop layer. First hard mask layer 30, like etch stop layer 16, will comprise an etchable material different from the material used to form low k dielectric layer 20 so that low k layer 20 may be etched independently of first hard mask layer 30. The material comprising first hard mask layer 30 must also be different from the material comprising capping layer 26 on upper low k dielectric layer 20. First hard mask layer 30 may, for example, comprise silicon nitride or silicon carbide when capping layer 26 comprises silicon oxide ($SiO_2$).

On the upper surface of first hard mask layer 30 may be formed a thin layer 38 of a conventional antireflective coating (ARC) material such as, for example, Shipley DUV 44, which will be used to facilitate the formation, by photolithography, of a first photoresist mask 40 having via openings 42 defined therein, as illustrated in FIG. 1. First hard mask layer 30 and ARC layer 38 will be anisotropically etched through first resist mask 40 to form first hard mask 34, as will now be described.

Figure 2:
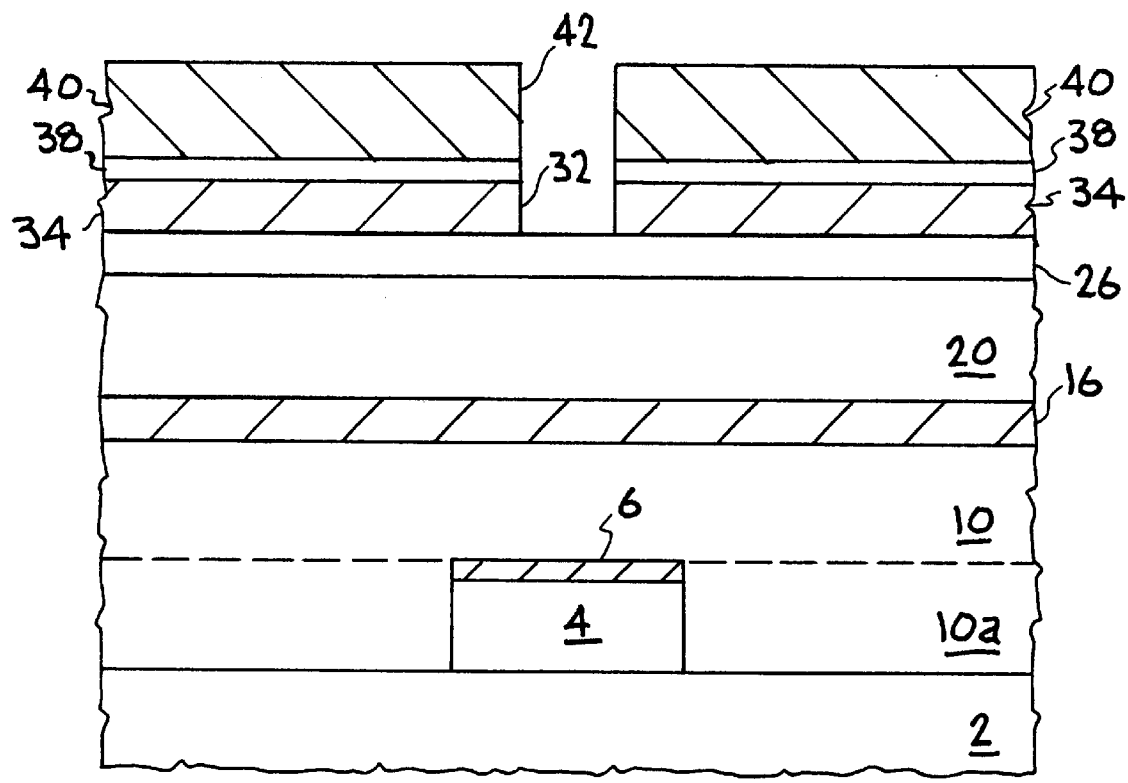
FIG. 2 shows the structure of FIG. 1 after etching of the ARC and the first hard mask layer through the first photoresist mask to form a first hard mask which replicates the photoresist mask.

As shown in FIG. 2, ARC layer 38, when present, is first etched through openings such as illustrated opening 42 in resist mask 40 using an appropriate etchant material. For example, when ARC layer comprises an organic material such as Shipley DUV 44, it may be etched using an etchant such as $O_2$, or a fluorocarbon etchant such as $CF_4$ or a combination of same. It should be noted that the etchant chosen for removal of the exposed portion of ARC layer is preferably selective to first photoresist mask 40. Alternatively, when the thickness of ARC layer 38 is much less that the thickness of first photoresist mask 40, careful control of the etch time will suffice.

Still referring to FIG. 2, after etching of ARC layer 38, first hard mask layer 30 is patterned using a suitable anisotropic etch system, with the etch stopping on capping layer 26 to thereby replicate or define, in first hard mask layer 30 the pattern of via openings such as opening 42 in first photoresist mask 40, thereby creating first hard mask 34 with via openings such as shown at 32. When first hard mask layer 30 comprises either silicon nitride or silicon carbide, the etchant system may comprise $O_2$ and a fluorocarbon such as $CF_4$ or $CHF_3$.

After formation of first hard mask 34, first photoresist mask 40 and underlying ARC layer 38 are conventionally removed, e.g., using an ashing system with $O_2$, leaving the newly formed first hard mask 34, having replicated therein at 32 the via pattern such as via opening 42 previously found in first photoresist mask 40. It should be noted at this point that, in accordance with the invention, first photoresist mask 40 has been removed without exposure of the surfaces of either low k dielectric layers 10 or 20 to the etchant system used in the removal of first photoresist mask 40. Thus, the removal of first photoresist mask 40 does not result in damage to either low k dielectric layers 10 or 20.

Figure 3:
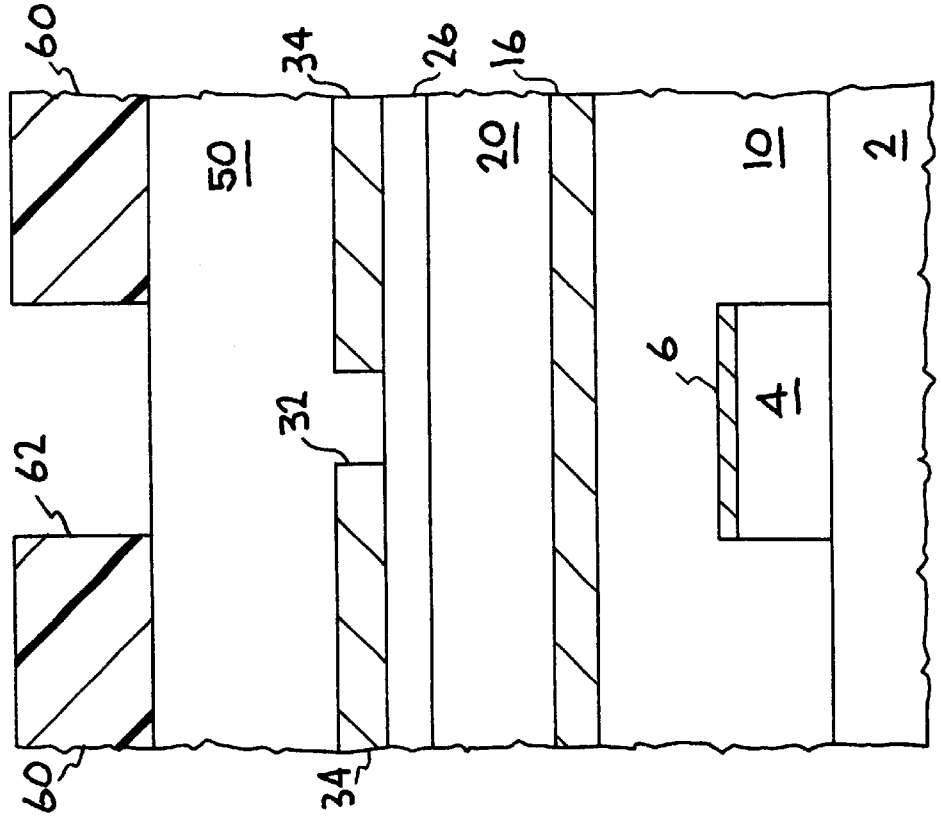
FIG. 3 shows the structure of FIG. 2 after removal of the first photoresist mask, formation of a second hard mask layer over the first hard mask, and a second photoresist mask formed over the second hard mask layer with a trench opening shown in the second photoresist mask.

As shown in FIG. 3, a second hard mask layer 50 is then formed over first hard mask 34 and in via mask opening 32 therein. Second hard mask layer 50 will be used to form the trench hard mask as will be explained below. Second hard mask layer 50 must comprise a material capable of being selectively etched at a different rate than the material comprising first hard mask 34. For example, when first hard mask 34 comprises silicon nitride, second hard mask layer 50 may comprise silicon carbide or silicon oxide ($SiO_2$) or a low temperature (<400° C.) deposited polysilicon. Preferably, second hard mask layer 50 comprises silicon oxide ($SiO_2$). If first hard mask 34 is silicon nitride and second hard mask layer 50 is silicon carbide, second hard mask layer 50 may range in thickness from about 100 nm to about 300 nm, and typically may be about 200 nm in thickness. When second hard mask layer 50 comprises $SiO_2$, the thickness of second hard mask layer 50 should exceed the combined thickness of second low k carbon-doped silicon oxide dielectric layer 20 and silicon oxide capping layer 26, as will be explained below.

Figure 4:
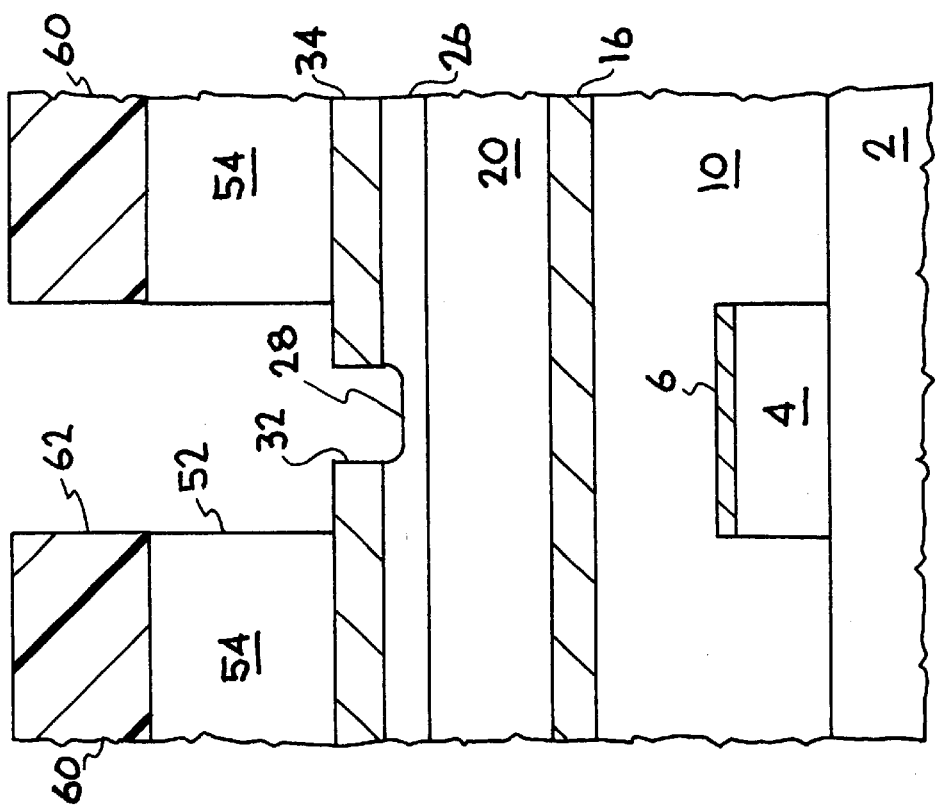
FIG. 4 shows the structure of FIG. 3 after etching of the second hard mask layer to form a second hard mask which replicates the second photoresist mask.

Still referring to FIG. 3, a second photoresist mask 60 is formed over second hard mask layer 50, having one or more trench openings defined therein, as shown by illustrated trench opening 62 in resist mask 60. (It should be noted that an ARC layer (not shown) may be formed over second hard mask layer 50 prior to the photolithographical formation of second photoresist mask 60 thereon similar to the previously described ARC layer 38.) Second hard mask layer 50 is anisotropically etched through resist mask 60 to replicate trench openings 62 of resist mask 60 in second hard mask layer 50, as shown at 52 in FIG. 4, resulting in the formation of second hard mask 54, i.e., trench hard mask 54. When second hard mask layer 50 comprises silicon carbide, the etch system may comprise fluorocarbons such as $CF_4$ or $CHF_3$ with $O_2$ in a preselected ratio which will be selective to silicon nitride, i.e., will etch silicon carbide at a faster rate than silicon nitride, allowing first hard mask 34 to therefore function as an etch stop for the etching of second hard mask layer 50. Similarly, when second hard mask layer 50 comprises silicon oxide ($SiO_2$), the anisotropic etch system will also comprise an etch system selective to silicon nitride to permit first hard mask etch 34 to function as an etch stop. As shown in FIG. 4, when second hard mask layer 50 is etched, the portion of second hard mask layer 50 formed, e.g., deposited, in previously formed via opening 32 in first hard mask 34 will also be removed, with the etch stopping in underlying capping layer 26, as shown at 28.

The stopping, at first hard mask 34 and capping layer 26, of the etch of second hard mask layer 50 through second photoresist mask 60 to form second hard mask 54 is very important to the practice of the process of the invention because, as seen in both FIGS. 4 and 5, the etch at this point has not reached second low k silicon oxide dielectric layer 20. Therefore, as shown in FIG. 5, second photoresist mask 60 may now be removed by a conventional ashing process, e.g., using $O_2$, without the risk of damage to either of the low k silicon oxide dielectric layers such as experienced in the prior art.

After removal of second photoresist mask 60, the remainder of capping layer 26 exposed in via opening 32 in first or via hard mask 34 is etched away, as well as the then exposed portion of underlying second low k silicon oxide dielectric layer 20, as shown in FIG. 6, with the etch stopping at etch stop layer 16. It will be noted in FIG. 6, that when second hard mask 54 also comprises silicon oxide (SiO₂), a portion of second hard mask 54 will also be removed during this etching step. But, since second hard mask layer 50 (when it comprises silicon oxide) was formed thicker than the combined thickness of silicon oxide capping layer 26 and second low k silicon oxide dielectric layer 20, to permit subsequent replication in first hard mask 34 of the trench openings 52 in second hard mask 54, as will be described below, a portion 54a of second hard mask 54 remains after this initial etching of second low k silicon oxide dielectric layer 20 down to etch stop layer 16. This is shown in FIG. 6.

Figure 7:
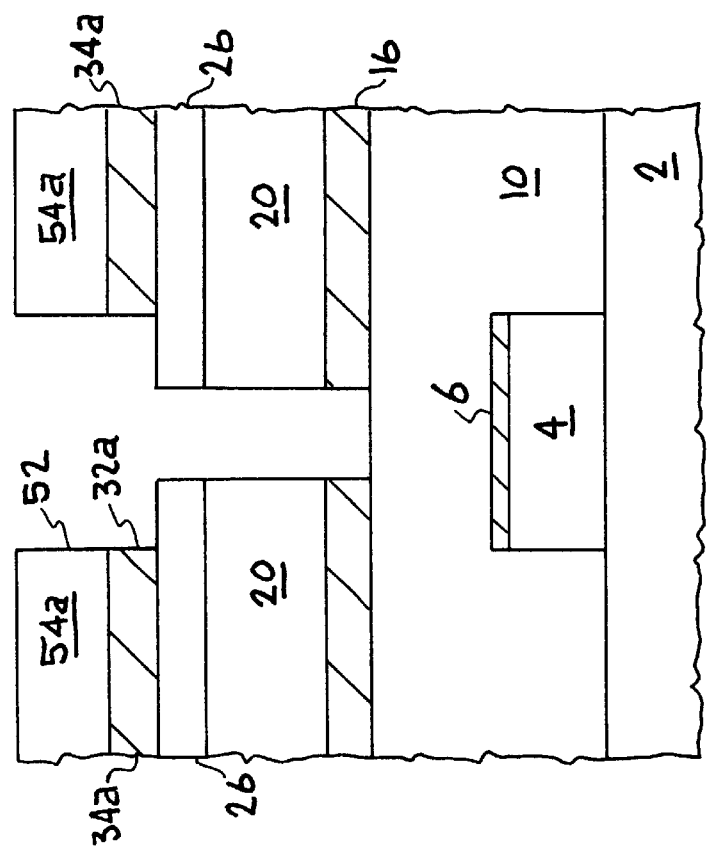
FIG. 7 shows the structure of FIG. 6 after removal of exposed portions of the first hard mask and the etch stop layer.

After this initial etching of second low k silicon oxide dielectric layer 20, the etchant system is changed to now remove the exposed portion 16a of etch stop layer 16 and, when both etch stop layer 16 and first hard mask 34 comprise the same material, also removing exposed portions 36 of first hard mask 34 not beneath second hard mask 54, leaving first hard mask 34a with an opening 32a therein replicating the trench opening 52 in second hard mask 54a. If etch stop layer 16 and first hard mask 34 comprise different materials, they can, instead, be removed in two sequential steps if desired. The result, in either case, is shown in FIG. 7. It should be noted at this point that if desired, etch stop layer 16 could be eliminated when second hard mask layer 54 comprises silicon oxide. In such case, the previously described etching of second low k silicon oxide dielectric layer 20 will stop on exposed portions 36 of first etch mask 34, following which such exposed portions 36 of first hard mask 34 are removed as above. However, it is preferred to retain etch stop layer 16 regardless of the material used for second hard mask 54, to retain via definition.

Figure 8:
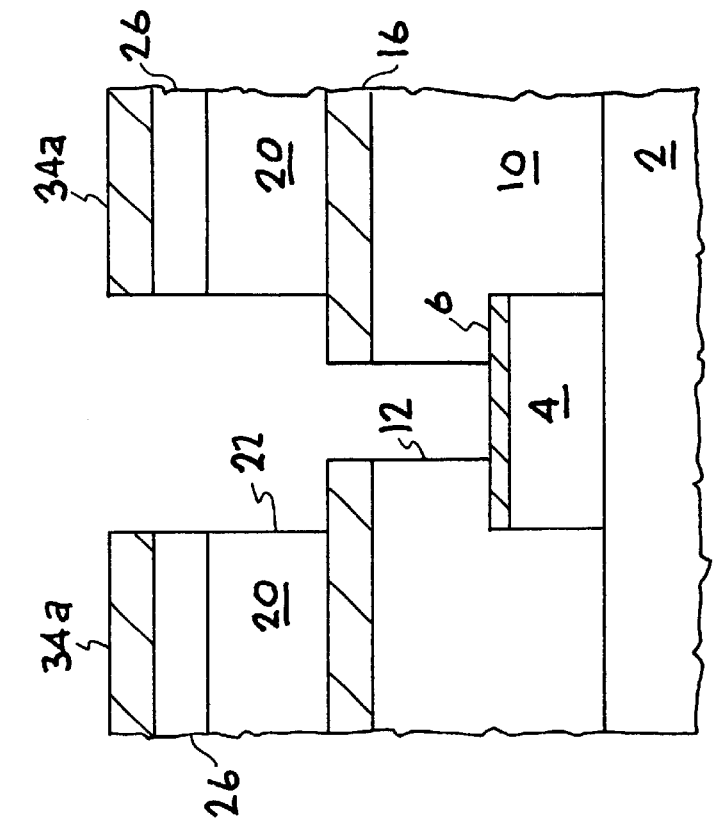
FIG. 8 shows the structure of FIG. 7 after formation of the via opening through the lower layer of low k carbon-doped silicon oxide dielectric material down to the capping layer on the raised conductor, and the simultaneous formation of the trench through the upper layer of low k carbon-doped silicon oxide dielectric material down to the etch stop layer.

In any event, after removal of exposed portions 36 of first hard mask 34, etching of first low k silicon oxide dielectric layer 10 and second low k silicon oxide dielectric layer 20 is now carried out (simultaneously) to define via opening 12 in first low k silicon oxide dielectric layer 10 and trench opening 22 in second low k silicon oxide dielectric layer 20, as shown in FIG. 8, with the via etch stopping at protective cap 6 and the trench etch stopping at etch stop layer 16.

The remaining portions 54a of second hard mask 54 and the remaining portions 34a of first hard mask 34 thus serve to define trench opening 22 etched in second low k silicon oxide dielectric layer 20, and the opening previously etched in etch stop layer 16 by the removal of exposed portion 16a serves as a via etch mask to form via 12 in first low k silicon oxide dielectric layer 10. When etch stop layer 16 is not used, the previously etched via opening in second low k silicon oxide dielectric layer 20 may serve as the etch mask for the etching of via opening 12 in first low k silicon oxide dielectric layer 10. The etch is carried out until protective cap 6 on raised conductor 6 is reached, for via opening 12 being etched in first low k silicon oxide dielectric layer 10, and etch stop layer 16 (when present) is reached for trench opening 22 being simultaneously etched in second low k silicon oxide dielectric layer 20, as shown in FIG. 8.

Figure 9:
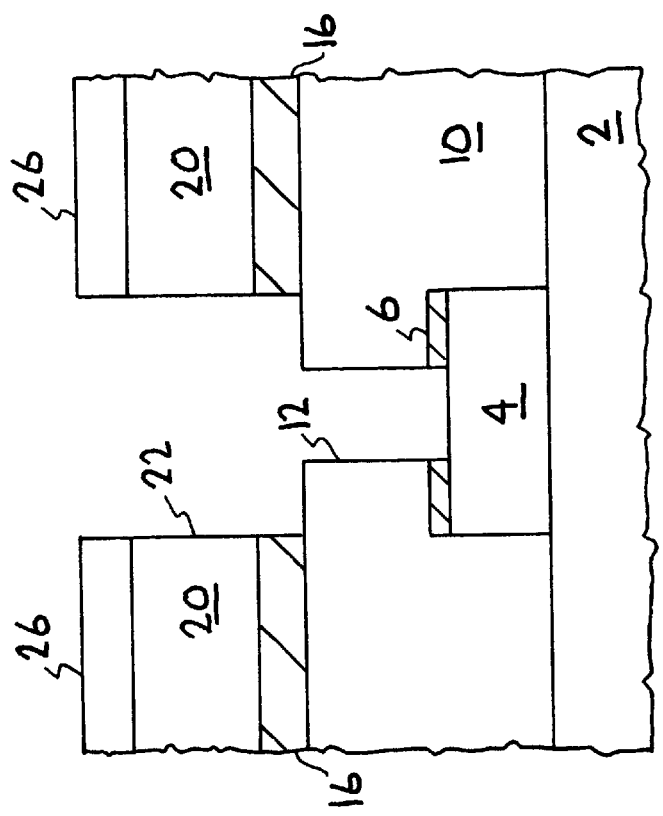
FIG. 9 shows the structure of FIG. 8 after removal of the first hard mask and exposed portions of the etch stop layer and the capping layer on the raised conductor.

As shown in FIG. 9, remaining portions 34a of first hard mask 34, exposed portions of etch stop layer 16 (when present), and exposed portions of protective cap 6 are then removed, leaving the structure shown in FIG. 9.

Figure 10:
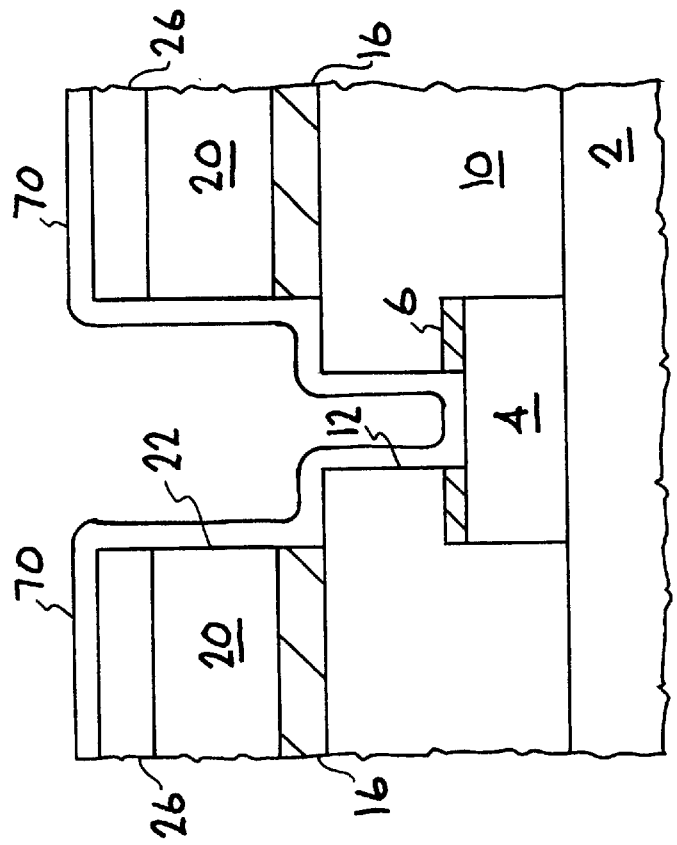
FIG. 10 shows the structure of FIG. 9 with the trench and via openings in the respective layers of low k carbon-doped silicon oxide dielectric material lined with a material such as tantalum compatible with both the low k carbon-doped silicon oxide dielectric material and the conductive metal which will be used to simultaneously fill both the trench and the via.

At this stage of the process, the resulting structure may be conventionally processed by providing, by way of example, a lining 70 over the sidewalls of trench opening 22 in second layer 20 of low k silicon dioxide dielectric material and the sidewalls of via opening 12 in first layer 10 of low k silicon dioxide dielectric material, as well as over raised conductor 4, as shown in FIG. 10. Lining 70 will comprise a material, such as, for example, tantalum, which is compatible with both the low k carbon-doped silicon oxide dielectric material and the conductive metal which will be used to simultaneously fill both the trench and the via.

Figure 12:
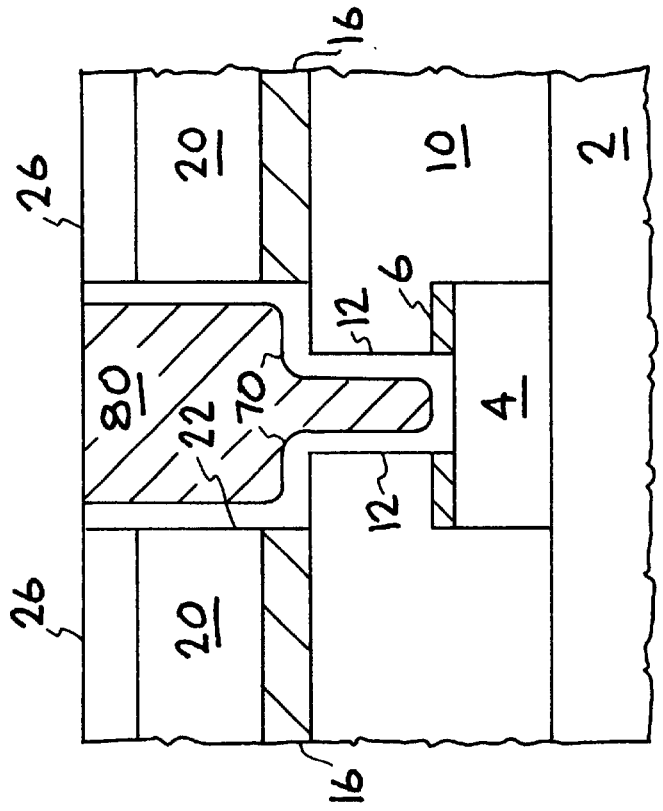
FIG. 12 shows the structure of FIG. 11 with the excess metal and liner material on the surface of the capping layer over the low k carbon-doped silicon oxide dielectric material removed, leaving liner and metal only in the trench and underlying via.
Figure 11:
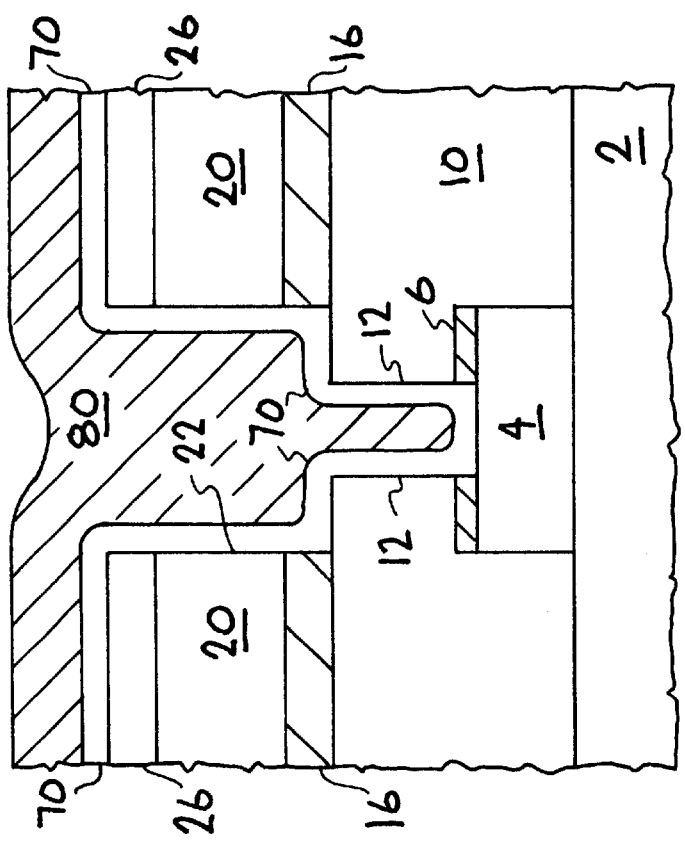
FIG. 11 shows the structure of FIG. 10 with the lined trench and via shown filled with a metal such as copper.

A blanket deposition of a copper layer 80 can then be carried out, as shown in FIG. 11, to simultaneously fill both trench opening 22 and via opening 12. Removal of the portions of copper layer 80 and liner 70 deposited on the top surface of capping layer 26 can then be conventionally removed, e.g., by chemical/mechanical polishing (CMP), resulting in the structure shown in FIG. 12.

To further illustrate the process of the invention, a silicon wafer may be provided, having portions of an integrated circuit previously formed thereon including raised conductors, each with a 60 nm thick titanium nitride cap formed thereon, and low k carbon-doped silicon oxide dielectric material formed between the raised conductors to the level of the titanium nitride caps to form a planar structure.

A first layer of low k carbon-doped silicon oxide dielectric material is formed over this planar structure to a thickness of about 500 nm. A silicon nitride etch stop layer can be formed over this first low k layer to a thickness about 100 nm, and a second layer of low k carbon-doped silicon oxide dielectric material, having a thickness of 500 nm, would then be formed over this etch stop layer. A 50 nm thick protective capping layer of conventional silicon oxide (SiO₂) would then be formed over the top of the second layer of low k carbon-doped silicon oxide dielectric material. A first hard mask layer of silicon nitride would then be formed over the protective capping layer to a thickness of about 100 nm. A 60 nm thick ARC layer of Shipley DUV 44 would then be formed over this first hard mask layer, and a first photoresist mask having a pattern of via openings therein would be photolithographically formed over the ARC layer.

The ARC layer and the underlying silicon nitride first hard mask layer would then be etched through the first photoresist mask, using a conventional RIE system with CF₄ and O₂ chemistry selective to silicon oxide to etch both the ARC layer and the silicon nitride first hard mask layer, with the etch stopping at the underlying protective capping layer. This prevents exposure of the underlying second layer of low k carbon-doped silicon oxide dielectric material during the etching step, while replicating in the first hard mask of silicon nitride the pattern of via openings in the resist mask. The first photoresist mask is then removed by a conventional ashing process using a microwave downstream plasma asher with O₂, with the protective capping layer serving to protect the underlying layers of low k carbon-doped silicon oxide dielectric material from attack by the etch materials used to remove the first photoresist mask.

A second hard mask layer of conventional silicon oxide (SiO₂) is then formed over the first hard mask, with the thickness of the silicon oxide second hard mask layer exceeding the sum of the thicknesses of the second layer of low k carbon-doped silicon oxide dielectric material plus the thickness of the protective capping layer of conventional silicon oxide. A second photoresist mask having a pattern of trench openings therein would then be formed photolithographically over the second hard mask layer (with or without an ARC layer therebetween). The second hard mask layer would then be etched through the second photoresist mask, using a conventional RIE system with CF₄ and O₂ chemistry etch system, to form a second hard mask with the pattern of trench openings in the second resist mask replicated in this second hard mask, with the etch stopping at the first hard mask and the exposed portion of the underlying protective capping layer. The second photoresist mask would then be removed using a similar ashing system to that used to remove the first photoresist mask, with the layers of low k carbon-doped silicon oxide dielectric material again being protected from the reagents used to remove the second photoresist mask.

The exposed portions of the upper layer of low k carbon-doped silicon oxide dielectric material would then be etched through the via openings in the first hard mask down to the silicon nitride etch stop layer, using a silicon oxide etch system selective to silicon nitride such as a conventional RIE system with $C_4F_8$ chemistry. The exposed portions of the silicon nitride first hard mask and the exposed portion of the silicon nitride etch stop layer would then be removed by a silicon nitride etch selective to silicon oxide, such as a RIE system with $CH_2F_2$ or $CHF_3$ chemistry. This would be followed by a further silicon oxide etch selective to silicon nitride to simultaneously form both the via openings in the lower or first layer of low k carbon-doped silicon oxide dielectric material and the trench openings in the upper or second layer of low k carbon-doped silicon oxide dielectric material, with the trench etch stopping at the silicon nitride etch stop layer and the via etch stopping at the titanium nitride cap over the raised conductor. The exposed nitride portions (the silicon nitride first hard mask, the exposed portions of the silicon nitride etch stop layer, and the titanium nitride cap would then all be removed by an etch or etches selective to silicon oxide.

The trenches and vias would then be lined with a 25 nm thick layer of tantalum blanket deposited over all of the trench and via surfaces as well as over the upper horizontal surface of the protective capping layer over the upper layer of low k carbon-doped silicon oxide dielectric material. A 200 nm thick copper layer would then be blanket deposited over the entire structure to completely fill all of the vias and the trenches, with the excess copper depositing over the portions of the tantalum lining on the horizontal surfaces over the protective capping layer.

This excess copper and tantalum on the horizontal surfaces can then be removed using a conventional chemical/mechanical polishing (CMP) procedure using the protective capping layer over the upper layer of low k carbon-doped silicon oxide dielectric material as the stop, leaving copper in all of the vias and forming the desired copper interconnects in the copper-filled trenches.

Examination of the finished structure under a 50×–100× microscope will show that all of the trenches have been completely filled with copper. Electrical testing of the structure using a parametric test system will further confirm that all of the vias have been filled and that the layers of low k carbon-doped silicon oxide dielectric material have not been damaged by the process of forming and filling the vias and trenches (including the steps of removing the first and second photoresist masks using conventional ashing).

Thus the invention comprises a novel process and resulting product wherein trenches and vias can be respectively formed in layers of low k carbon-doped silicon oxide dielectric material, without damage to the low k carbon-doped silicon oxide dielectric material during conventional removal of the respective trench and via photoresist masks using hard masks in which the respective patterns of trenches and vias in the photoresist masks are replicated in the hard masks followed by removal of the photoresist masks prior to etching of the layers of low k carbon-doped silicon oxide dielectric material to form the trenches and vias therein.

Having thus described the invention what is claimed is:

1. In a process wherein a first photoresist mask is used to form via openings through a first layer of low k dielectric material, followed by removal of said first photoresist mask; and wherein a second photoresist mask is subsequently used to form trenches in a second layer of low k dielectric material corresponding to a desired pattern of metal interconnects for an integrated circuit structure, followed by removal of said second photoresist mask; the improvements which comprise:

a) forming a first hard mask layer over an upper layer of low k dielectric material previously formed over a lower layer of low k dielectric material on an integrated circuit structure, said first hard mask layer comprising a material different from said upper and lower layers of low k dielectric material;

b) forming, over said first hard mask layer, a first photoresist mask having a pattern of via openings therein;

c) etching, through said first photoresist mask, said first hard mask layer to form a first hard mask having said pattern of vias openings replicated therein without etching said layers of low k dielectric material beneath said first hard mask;

d) then removing said first photoresist mask;

e) forming a second hard mask layer over said first hard mask;

f) forming, over said second hard mask layer, a second photoresist mask having a pattern of trench openings therein;

g) etching, through said second photoresist resist mask, said second hard mask layer to form a second hard mask having said pattern of trench openings replicated therein without etching said layers of low k dielectric material beneath said first and second hard masks;

h) then removing said second photoresist mask; and i) then using said first and second hard masks to form said via openings in said lower layer of low k dielectric material and said trench openings in said upper layer of low k dielectric material;

whereby a pattern of via openings and a pattern of trench openings can be respectively formed in layers of low k dielectric material without damage to said low k dielectric material during removal of photoresist masks used respectively in the formation of said respective patterns of via openings and trench openings.

2. The process of claim 1 wherein at least one of said layers of low k dielectric material comprises low k silicon oxide dielectric material.

3. The process of claim 2 wherein both of said layers of low k dielectric material comprise low k silicon oxide dielectric material.

4. The process of claim 3 wherein at least one of said layers of low k silicon oxide dielectric material comprises low k carbon-doped silicon oxide dielectric material.

5. The process of claim 3 wherein both of said layers of low k silicon oxide dielectric material comprise low k carbon-doped silicon oxide dielectric material.

6. The process of claim 3 including the further step of forming an etch stop layer between said lower and upper layers of low k silicon oxide dielectric material.

7. The process of claim 6 wherein said further step of forming an etch stop layer between said lower and upper layers of low k silicon oxide dielectric material comprises forming a silicon nitride etch stop layer between said lower and upper layers of low k silicon oxide dielectric material.

8. The process of claim 3 wherein said first hard mask comprises silicon nitride and said step of using said first and second hard masks to respectively form said via openings in said lower layer of low k silicon oxide dielectric material and said trench openings in said upper layer of low k silicon oxide dielectric material further comprises:
   a) using said first hard mask to form said via openings in said upper layer of low k silicon oxide dielectric material beneath said first hard mask;
   b) removing exposed portions of said first hard mask; and
   c) then using said second hard mask to form said trench openings in said upper layer of low k silicon oxide dielectric material beneath said first hard mask; while forming said via openings in said lower layer of low k silicon oxide dielectric material.

9. The process of claim 8 wherein said second hard mask comprises a material selected from the group consisting of silicon carbide and silicon oxide.

10. The process of claim 8 wherein said second hard mask comprises silicon oxide.

11. The process of claim 10 wherein both of said layers of low k silicon oxide dielectric material comprises low k carbon-doped silicon oxide dielectric material.

12. The process of claim 7 wherein said first hard mask comprises silicon nitride and said step of using said first and second hard masks to respectively form said via openings in said lower layer of low k silicon oxide dielectric material and said trench openings in said upper layer of low k silicon oxide dielectric material further comprises:
   a) using said first hard mask to form said via openings in said upper layer of low k silicon oxide dielectric material beneath said first hard mask down to said etch stop layer;
   b) removing exposed portions of said etch stop layer over said lower layer of low k silicon oxide dielectric material to form openings in said etch stop layer, and removing exposed portions of said first hard mask; and
   c) then using said second hard mask to form said trench openings in said upper layer of low k silicon oxide dielectric material beneath said first hard mask; while forming said via openings in said lower layer of low k silicon oxide dielectric material through the openings in said etch stop layer.

13. The process of claim 12 wherein said second hard mask comprises a material selected from the group consisting of silicon carbide and silicon oxide.

14. The process of claim 12 wherein said second hard mask comprises silicon oxide.

15. The process of claim 14 wherein both of said layers of low k silicon oxide dielectric material comprises low k carbon-doped silicon oxide dielectric material.

16. The product formed by the process of claim 1, characterized by layers of low k dielectric material undamaged by removal of photoresist masks used respectively in the formation of said respective patterns of via openings and trench openings in said layers of low k dielectric material.

17. A process for forming copper interconnects and copper-filled vias in layers of low k carbon-doped silicon oxide dielectric material without damaging exposed surfaces of said layers of low k carbon-doped silicon oxide dielectric material during removal of photoresist masks respectively used to define a pattern of openings in said low k carbon-doped silicon oxide dielectric material for said vias and a pattern of trenches in said low k carbon-doped silicon oxide dielectric material for forming said copper-filled interconnects, said process comprising:
   a) forming a first layer of low k carbon-doped silicon oxide dielectric material over an integrated circuit structure;
   b) forming, over said first layer of low k carbon-doped silicon oxide dielectric material, a second layer of low k carbon-doped silicon oxide dielectric material;
   c) forming a capping layer of silicon oxide over said second layer of low k carbon-doped silicon oxide dielectric material;
   d) forming, from a material selected from the group consisting of silicon carbide and silicon nitride, a first hard mask layer over said silicon oxide capping layer;
   e) forming over said first hard mask layer; a first photoresist mask, having a pattern of via openings formed therein by photolithography;
   f) etching said first hard mask layer through said first photoresist mask to form a first hard mask replicating therein said pattern of via openings in said first photoresist mask, with said etching stopping at said silicon oxide capping layer without reaching said second layer of low k carbon-doped silicon oxide dielectric material;
   g) removing said first photoresist mask;
   h) forming, over said first hard mask, a second hard mask layer comprising a material different from said first hard mask;
   i) forming a second photoresist mask over said second hard mask layer, said second photoresist mask having a pattern of openings therein defining trenches to be formed;
   j) etching said second hard mask layer through said second photoresist mask to form a second hard mask having said pattern of openings defining trenches replicated in said second hard mask;
   k) removing said second photoresist mask;
   l) etching said second layer of low k carbon-doped silicon oxide dielectric material through said first hard mask to define via openings in said second layer of low k carbon-doped silicon oxide dielectric material;
   m) removing exposed portions of said first hard mask;
   n) etching said second layer of low k carbon-doped silicon oxide dielectric material through said first and second hard masks to form a pattern of trenches in said second layer of low k carbon-doped silicon oxide dielectric material; and
   o) etching said first layer of low k carbon-doped silicon oxide dielectric material through said via openings previously formed in said second layer of low k carbon-doped silicon oxide dielectric material to form via openings in said first layer of low k carbon-doped silicon oxide dielectric material;
whereby trenches and vias are respectively formed in layers of low k carbon-doped silicon oxide dielectric material without exposing said layers of low k carbon-doped silicon oxide dielectric material to the materials used to remove the respective trench and via photoresist masks.

18. The process of claim 17 including the further steps, after formation of said via openings in said first layer of low k carbon-doped silicon oxide dielectric material, of:
   a) cleaning said structure to remove etch residues;
   b) lining said trenches and vias with a suitable lining material;

c) filling said lined trenches and vias with copper filler material.

19. The process of claim 18 including the further step of removing excess copper, lining material, and any remaining first hard mask material from the surface of said capping layer on said second layer of low k carbon-doped silicon oxide dielectric material; whereby copper-filled trenches and vias are formed in layers of low k carbon-doped silicon oxide dielectric material without exposing said layers of low k carbon-doped silicon oxide dielectric material to the materials used to remove the respective trench and via photoresist masks.

20. The process of claim 17 wherein said second hard mask comprises silicon oxide ($SiO_2$), and the thickness of said second hard mask is greater than the sum of the thicknesses of said second layer of low k carbon-doped silicon oxide dielectric material and said capping layer over said second layer of low k carbon-doped silicon oxide dielectric material.

21. The process of claim 17 including the further step of forming an etch stop layer between said first and second layers of low k carbon-doped silicon oxide dielectric material.

22. The process of claim 21 wherein said etch stop layer comprises silicon nitride.

23. The product formed by the process of claim 17, characterized by layers of low k carbon-doped silicon oxide dielectric material undamaged by removal of photoresist masks used respectively in the formation of said patterns of via openings and trench openings in said layers of low k carbon-doped silicon oxide dielectric material.

24. A process for forming copper interconnects and copper-filled vias in layers of low k carbon-doped silicon oxide dielectric material without damaging exposed surfaces of said layers of low k carbon-doped silicon oxide dielectric material during removal of photoresist masks respectively used to define a pattern of openings in said low k carbon-doped silicon oxide dielectric material for said vias and a pattern of trenches in said low k carbon-doped silicon oxide dielectric material for forming said copper-filled interconnects, said process comprising:

a) forming a first layer of low k carbon-doped silicon oxide dielectric material over an integrated circuit structure;

b) forming, over said first layer of low k carbon-doped silicon oxide dielectric material, an etch stop layer comprising a different material than the low k carbon-doped silicon oxide dielectric material;

c) forming a second layer of low k carbon-doped silicon oxide dielectric material over said etch stop layer;

d) forming a capping layer of silicon oxide over said second layer of low k carbon-doped silicon oxide dielectric material;

e) forming a first hard mask layer over the capping layer, from a material different than either said capping layer or said first layer of low k carbon-doped silicon oxide dielectric material;

f) forming over said first hard mask layer; a first photoresist mask, having a pattern of via openings formed therein by photolithography;

g) etching said first hard mask layer through said first photoresist mask to form a first hard mask defining therein said pattern of via openings in said first photoresist mask, with said etching stopping at said silicon oxide capping layer without reaching said second layer of low k carbon-doped silicon oxide dielectric material;

h) removing said first photoresist mask;

i) forming a second hard mask layer over said first hard mask;

j) forming a second photoresist mask over said second hard mask layer, said second photoresist mask having a pattern of openings therein defining trenches to be formed;

k) etching said second hard mask layer through said second photoresist mask to form a second hard mask having said pattern of openings defining trenches formed in said second hard mask; with said etch stopping at said first hard mask;

l) removing said second photoresist mask;

m) etching said second layer of low k carbon-doped silicon oxide dielectric material through said first hard mask down to said etch stop layer to define via openings in said second layer of low k carbon-doped silicon oxide dielectric material;

n) removing exposed portions of said first hard mask and exposed portions of said etch stop layer;

o) etching said second layer of low k carbon-doped silicon oxide dielectric material through the first and second hard masks to form a pattern of trenches in said second layer of low k carbon-doped silicon oxide dielectric material;

p) etching said first layer of low k carbon-doped silicon oxide dielectric material through said openings in said etch stop layer to form vias in said first layer of low k carbon-doped silicon oxide dielectric material;

q) cleaning the structure to remove etch residues;

r) lining said trenches and vias with a suitable lining material;

s) filling said lined trenches and vias with copper filler material;

t) removing excess copper, lining material, and first hard mask material from the surface of said capping layer on said second layer of low k carbon-doped silicon oxide dielectric material;

whereby copper-filled trenches and vias are formed in layers of low k carbon-doped silicon oxide dielectric material without exposing said layers of low k carbon-doped silicon oxide dielectric material to the materials used to remove the respective trench and via photoresist masks.

25. The process of claim 24 wherein said etch stop layer comprises silicon nitride.

26. The process of claim 24 wherein said first hard mask comprises silicon nitride.

27. The process of claim 24 wherein said second hard mask comprises silicon oxide ($SiO_2$).

28. The product formed by the process of claim 24, characterized by layers of low k carbon-doped silicon oxide dielectric material undamaged by removal of photoresist masks used respectively in the formation of said patterns of via openings and trench openings in said layers of low k carbon-doped silicon oxide dielectric material.

* * * * *